(12) United States Patent
Hill

(10) Patent No.: US 7,057,739 B2
(45) Date of Patent: Jun. 6, 2006

(54) SEPARATED BEAM MULTIPLE DEGREE OF FREEDOM INTERFEROMETER

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 304 days.

(21) Appl. No.: 10/364,300

(22) Filed: Feb. 11, 2003

(65) Prior Publication Data

US 2003/0186136 A1 Oct. 2, 2003

Related U.S. Application Data

(60) Provisional application No. 60/356,394, filed on Feb. 12, 2002.

(51) Int. Cl.
*G01B 9/02* (2006.01)

(52) U.S. Cl. .................................... 356/500

(58) Field of Classification Search .............. 356/484, 356/485, 486, 487, 491, 492, 493
See application file for complete search history.

(56) References Cited

U.S. PATENT DOCUMENTS

| | | | |
|---|---|---|---|
| 4,606,638 A | 8/1986 | Sommargren | 356/351 |
| 4,881,816 A | 11/1989 | Zanoni | 356/349 |
| 5,064,289 A | 11/1991 | Bockman | 356/351 |
| 5,187,543 A | 2/1993 | Ebert | 356/349 |
| 5,801,832 A | 9/1998 | Van Den Brink | 356/358 |
| 6,020,964 A * | 2/2000 | Loopstra et al. | 356/500 |
| 6,046,792 A | 4/2000 | Van Der Werf et al. | 355/53 |
| 6,271,923 B1 | 8/2001 | Hill | 356/487 |
| 6,304,318 B1 | 10/2001 | Matsumoto | 355/55 |

* cited by examiner

*Primary Examiner*—Hwa Lee
*Assistant Examiner*—Michael A. Lyons
(74) *Attorney, Agent, or Firm*—Fish & Richardson P.C.

(57) ABSTRACT

An interferometric apparatus includes: a polarizing beam-splitting interface positioned to separate an input beam into two orthogonally polarized beams; and interferometer optics positioned to receive a first set of beams derived from one of the orthogonally polarized beams and a second set of beams derived from the other of the orthogonally polarized beams. The interferometer optics are configured to direct each beam in the first set to contact different locations of a measurement object at least once, and subsequently combine each beam in the first set with a corresponding beam from the second set of beams to produce a corresponding output beam comprising information about changes in the position of the measurement object with respect to a different degree of freedom.

68 Claims, 10 Drawing Sheets

SEPARATED BEAM MULTIPLE DEGREE OF FREEDOM INTERFEROMETER

CROSS-REFERENCE TO RELATED APPLICATIONS

This application claims priority under 35 U.S.C. § 119(e) to U.S. Provisional Application Ser. No. 60/356,394 entitled "SEPARATED BEAM MULTIPLE DEGREE OF FREEDOM INTERFEROMETER," by Henry A. Hill and filed 12 Feb. 2002. The contents of said provisional application is incorporated herein by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2 \text{ v} np/\lambda$, where $v$ is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2 (2\pi pnL)/\lambda$. Higher harmonic cyclic errors can also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "Method of and Device for Repetitively Imaging a Mask Pattern on a Substrate Using Five Measuring Axes," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may generated from physically separate interferometers or from multi-axes interferometers that generate multiple measurement beams.

SUMMARY

The invention features interferometer systems that measure changes in the relative position of a measurement object with respect to multiple degrees of freedom. For example, the degrees of freedom may include changes in distance to the measurement object along one or more different measurement axes and/or changes in the angular orientation of the measurement object with respect to one or more rotation axes. Embodiments include systems that use an initial polarizing beam-splitting interface to separate an input beam suitable for heterodyne interferometry into orthogonally polarized beams, which are then separated into multiple beams and directed to an interferometer for measuring the changes in the position of the measurement object with respect to the multiple degrees of freedom. In many embodiments, the spatial separation of the polarization components of the input beam prior to entering the interferometer tends to reduce cyclic errors in the interferometer system.

We now summarize different aspects and features of the invention.

In general, in one aspect, the invention features an interferometric apparatus including: a polarizing beam-splitting interface positioned to separate an input beam into two orthogonally polarized beams; and interferometer optics positioned to receive a first set of beams derived from one of the orthogonally polarized beams and a second set of beams derived from the other of the orthogonally polarized beams. The interferometer optics are configured to direct each beam in the first set to contact different locations of a measurement object at least once, and subsequently combine each beam in the first set with a corresponding beam from the second set of beams to produce a corresponding output beam including information about changes in the position of the measurement object with respect to a different degree of freedom.

Embodiments of the interferometric apparatus may include any of the following features.

The apparatus may further include a light source for producing the input beam and directing it to the polarizing beam-splitting interface, wherein the light source is configured to generate a frequency splitting suitable for heterodyne detection between the orthogonal polarized components of the input beam.

Each beam from the first set of beams may be spatially separated from the corresponding beam from the second set upon entering the interferometer optics.

The beams in the first and second sets may have the same polarization upon entering the interferometer optics.

One of the output beams may include information about changes in distance to a first location on the measurement object. Another of the output beams may include information about changes in distance to a second location on the measurement object, wherein the second location different from the first location.

The interferometer optics may direct at least one of the beams from the first set to contact the measurement object at least twice before it is combined with the corresponding beam from the second set.

At least one of the output beams may include information about changes in an angular orientation of the measurement object with respect to a first rotation axis.

The interferometer optics may direct at least one of the beams from the first set to contact the measurement object only once and direct the corresponding beam from the second set to likewise contact the measurement object only once, but at a location different from that of the one beam in the first set, and prior to combining it with the one beam in the first set.

The measurement object includes a plane mirror.

The interferometer optics may be configured to produce more than two output beams, each of which provides information about changes in the position of the measurement object with respect to a different degree of freedom. For example, the system may further include a non-polarizing, input beam-splitting assembly configured to separate a progenitor input beam into the first-mentioned input beam and a parallel propagating second input beam spatially separated from the first input beam. In such a case, the input beam-splitting assembly is further configured to direct the spatially separated first and second input beams to the polarizing beam-splitter interface, wherein the polarizing beam-splitting interface is positioned to separate the second input beam into a second set of two orthogonally polarized beams, wherein interferometer optics are positioned to receive a third set of beams derived from one of the second set of orthogonally polarized beams and a fourth set of beams derived from the other of the second set of orthogonally polarized beams, and wherein the interferometer optics are configured to direct each beam in the third set of beams to contact different locations of a measurement object at least once, and subsequently combine each beam from the third set of beams with a corresponding beam from the fourth set of beams to produce a corresponding output beam including information about changes in the position of the measurement object with respect to a different degree of freedom.

The apparatus may further include polarization modification optics positioned to receive a first one of the orthogonally polarized beams and produce a modified polarized beam having a polarization orthogonal to that of the first polarized beam. For example, the first set of beams may be derived from the modified polarized beam, or the second set of beams may be derived from the modified polarized beam.

The polarization modification optics may include a retarder and at least one reflector. For example, the retarder (e.g., a quarter-wave retarder) and the reflector may be in sequence, and the reflector may be positioned to direct the first polarized beam back through the retarder to the polarizing beam splitter to define the modified polarized beam. In another example, the retarder may be a half-wave retarder positioned to receive the first polarized beam and produce the modified polarized beam, and wherein the at least one reflector includes a pair of reflectors.

The apparatus may further include non-polarizing beam-splitting optics positioned to generate the first and second sets of beams from the two orthogonally polarized beams. For example, the non-polarizing beam-splitting optics may include a first non-polarizing beams splitting interface positioned to generate at least two of the first set of beams and a second non-polarizing beam-splitting interface positioned to generate at least two of the second set of beams. Furthermore, the non-polarizing beam-splitting optics may include at least one reflector for causing the beams from the first set to be parallel to one another upon entering the interferometer optics. Also, the non-polarizing beam-splitting optics may further include at least one reflector for causing the beams from the second set to be parallel to one another upon entering the interferometer optics.

The apparatus may further include a second polarizing beam-splitting interface positioned in the interferometer optics. For example, the apparatus may further include a first polarizing beam-splitter optic defining the first-mentioned polarizing beam-splitter interface, and a second polarizing beam splitter optic in the interferometer optics defining the second polarizing beam-splitter interface. Alternatively, the apparatus may further include a common polarizing beam-splitter optic defining the first-mentioned polarizing beam-splitting interface and the second polarizing beam-splitting interface.

In addition to the second polarizing beam-splitting interface, the interferometer optics may further include a quarter wave retarder positioned between the second polarizing beam-splitting interface and the measurement object. Also, the interferometer optics may further includes a reference mirror and a quarter wave retarder positioned between the second polarizing beam-splitting interface and the reference mirror, wherein the second polarizing beam-splitting interface is positioned to direct each beam in the second set to contact the reference mirror at least once. Furthermore, the interferometer optics may includes fold optics positioned to receive from the second polarizing beam-splitting interface the first set of beams after they contact the measurement object for a first time and the second set of beams after they contact the reference mirror for a first time and subsequently direct the first and second sets of beams back to the second polarizing beam-splitting interface.

For example, upon receiving the first and second sets of beams from the fold optics, the second polarizing beam-splitting interface may be configured to direct each beam in the first set of beams to contact the measurement object for a second time and each beam in the second set of beams to contact the reference mirror for a second time.

The fold optics may also include a retarder (e.g., a half-wave retarder) positioned to receive a first one of the beams in the first set and the corresponding beam from the second set and rotate their respective polarizations by about 90 degrees before they return to the second polarizing beam-splitting interface. For example, upon receiving the first and second sets of beams from the fold optics including the retarder, the second polarizing beam-splitting interface may be configured to direct the first beam from the first set of beams to contact the reference mirror and direct the corresponding beam in the second set to contact the measurement object. Also, the fold optics may be configured to reflect the first beam from the first set and the corresponding beam from the second set an odd number of times from surfaces that have normal directions in a common plane when directing them back to the second polarizing beam-splitting interface.

In general, in another aspect, the invention features an interferometric method including: separating an input beam into two orthogonally polarized beams; directing each beam from a first set of beams derived from one of the orthogonally polarized beams to contact different locations of a measurement object at least once; and subsequently combining each beam in the first set with a corresponding beam from a second set of beams derived from the other one of the orthogonally polarized beams to produce a corresponding output beam including information about changes in the position of the measurement object with respect to a different degree of freedom.

Embodiments of the interferometric method may include method features corresponding to any of the features described above in connection with the interferometric apparatus.

In another aspect, the invention features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and any of the interferometric apparatus described above for monitoring the position of the wafer relative to the imaged radiation.

In another aspect, the invention features another lithography system for use in fabricating integrated circuits on a wafer. This lithography system includes: a stage for supporting the wafer; and an illumination system including a radiation source, a mask, a positioning system, a lens assembly, and any of the interferometric apparatus described above. During operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

In another aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and any of the interferometric apparatus described above for monitoring the position of the stage relative to the beam directing assembly.

In another aspect, the invention features a lithography method for use in fabricating integrated circuits on a wafer. The lithography method includes: supporting the wafer on a moveable stage; imaging spatially patterned radiation onto the wafer; adjusting the position of the stage; and monitoring the position of the stage using any of the interferometric methods described above.

In another aspect, the invention features another lithography method for use in the fabrication of integrated circuits. This lithography method includes: directing input radiation through a mask to produce spatially patterned radiation; positioning the mask relative to the input radiation; monitoring the position of the mask relative to the input radiation using any of the interferometry methods described above; and imaging the spatially patterned radiation onto a wafer.

In another aspect, the invention features a third lithography method for fabricating integrated circuits on a wafer including: positioning a first component of a lithography system relative to a second component of a lithography system to expose the wafer to spatially patterned radiation; and monitoring the position of the first component relative to the second component using any of the interferometric methods described above.

In another aspect, the invention features a method for fabricating integrated circuits, the method including any of the lithography methods described above.

In another aspect, the invention features a method for fabricating integrated circuits, the method including using any of the lithography systems described above.

In another aspect, the invention features a method for fabricating a lithography mask, the method including: directing a write beam to a substrate to pattern the substrate; positioning the substrate relative to the write beam; and monitoring the position of the substrate relative to the write beam using any of the interferometry methods described above.

Unless otherwise defined, all technical and scientific terms used herein have the same meaning as commonly understood by one of ordinary skill in the art to which this invention belongs. In case of conflict with publications, patent applications, patents, and other references mentioned incorporated herein by reference, the present specification, including definitions, will control.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
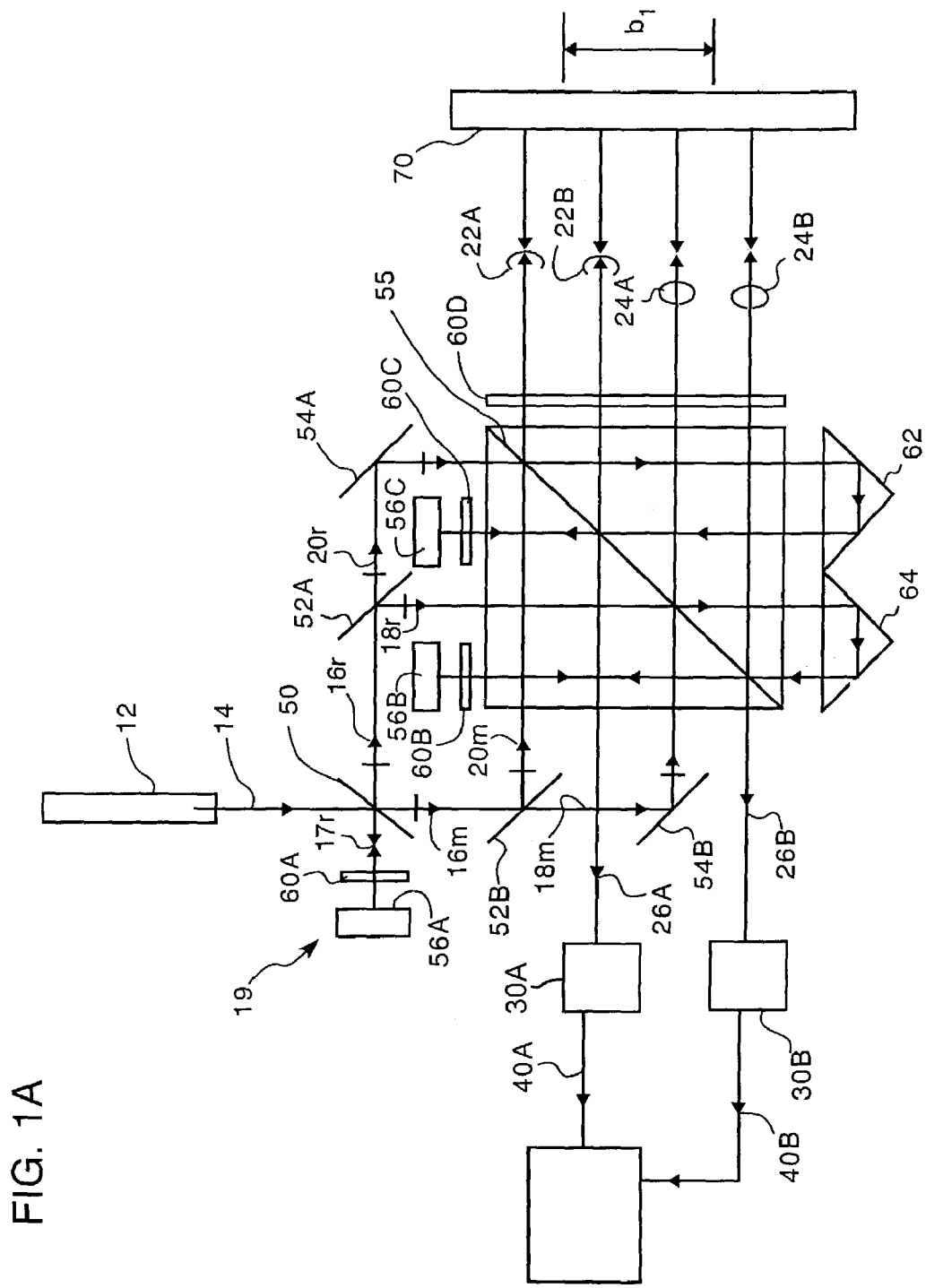
FIG. 1a is a schematic diagram of a first embodiment of an interferometric system.

A first embodiment is shown schematically in FIG. 1a and includes two high stability plane mirror interferometer (HSPMI) systems that share a common set of interferometer optics for measuring changes in the position of a plane mirror measurement object 70 with respect to multiple degrees of freedom. Optics positioned prior to the interferometer optics are configured to separate an input beam into two sets of spatially separated measurement and reference beams, each of which is then directed to a corresponding one of the HSPMI systems.

Referring to FIG. 1a, the first HSPMI system includes a polarizing beam-splitter 55, a first retroreflector 62, a first reference mirror 56C, a first reference quarter-wave plate 60C, a measurement quarter-wave plate 60D, and a detector 30A. The second HSPMI system includes polarizing beam-splitter 55, a second retroreflector 64, a second reference mirror 56B, a second reference quarter-wave plate 60B, measurement quarter-wave plate 60D, and a detector 30B.

An input beam 14 from a source 12 includes two components that are orthogonally polarized and have different frequencies. The different frequencies can be produced, for example, by laser Zeeman splitting, by acousto-optical modulation, or internal to the laser using birefringent elements or the like. One of the polarization components of input beam 14 is linearly polarized in the plane of FIG. 1a and is used to produce the measurement beams for the two HSPMI systems, the other of the polarization components of input beam 14 is linearly polarized orthogonal to the plane of FIG. 1a and is used to produce the reference beams for the two HSPMI systems.

A polarizing beam-splitter 50 is positioned to separate input beam 14 into two orthogonally polarized beams 16m and 17r, which correspond to the orthogonally polarized components of the input beam. It transmits the component of the input beam linearly polarized in the plane of FIG. 1a to define beam 16m, which is likewise linearly polarized in the plane of FIG. 1a. It reflects the component of the input beam linearly polarized orthogonal to the plane of FIG. 1a to define beam 17r, which is likewise linearly polarized orthogonal to the plane of FIG. 1a. Beam 17r is then incident on polarization modification optics 19, which include a quarter-wave plate 60A and a reflector 56A in sequence. Reflector 56A is oriented to direct beam 17r back through quarter-wave plate 60A to polarizing beam-splitter 50. The double-pass through quarter-wave plate 60A rotates the linear polarization of beam 17r by 90 degrees so that polarizing beam-splitter 50 transmits it to define beam 16r, which like beam 16m, is linearly polarized in the plane of FIG. 1a.

Referring still to FIG. 1a, a first portion of beam 16r is transmitted by a non-polarizing beam-splitter 52A as a first reference beam 20r, which is then reflected by reflector 54A to define the reference beam for the first HSPMI system. A second portion of beam 16r is reflected by non-polarizing beam-splitter 52A as a second reference beam 18r, which defines the reference beam for the second HSPMI.

Similarly, a first portion of beam 16m is reflected by non-polarizing beam-splitter 52B as a first measurement beam 20m, which defines the measurement beam for the first HSPMI. A second portion of beam 16m is transmitted by a non-polarizing beam-splitter 52B as a second measurement beam 18m, which is then reflected by reflector 54B to define the measurement beam for the second HSPMI system. Notably, each set of reference and measurement beams are spatially separated upon entering their respective HSPMI.

The path of reference beam 20r through the first HSPMI is as follows. It transmits through polarizing beam-splitter 55, is redirected by retroreflector 62 back to polarizing beam-splitter 55, which transmits it to quarter-wave plate 60C and reflector 56C. Reflector 56C then reflects it back through quarter-wave plate 60C to polarizing beam-splitter 55. The double pass through quarter-wave plate 60C rotates its linear polarization by 90 degrees so that polarizing beam-splitter 55 now reflects it as the reference beam component of a first output beam 26A.

The path of measurement beam 20m through the first HSPMI is as follows. It transmits through polarizing beam-splitter 55 and quarter-wave plate 60D as measurement beam 22A and contacts plane mirror measurement object 70, which reflects it back through quarter-wave plate 60D to polarizing beam-splitter 55. The double pass through quarter-wave plate 60D rotates its linear polarization by 90 degrees so that polarization beam-splitter 55 now reflects it to retroreflector 62, which in turn directs it back to polarizing beam-splitter 55. Polarizing beam-splitter 55 then directs it back through quarter-wave plate 60D as measurement beam 22B to contact plane mirror measurement object 70 a second time, which reflects it back through quarter-wave plate 60D and back to polarizing beam-splitter 55. This second double pass through quarter-wave plate 60D again rotates its linear polarization by 90 degrees so that polarization beam-splitter 55 now transmits it as the measurement beam component of first output beam 26A.

The paths of reference and measurement beams 18r and 18m, respectively, through the second HSPMI are similar to those of reference and measurement beams 20r and 20m, respectively, in the first HSPMI, and are described below for completeness.

The path of reference beam 18r through the second HSPMI is as follows. It transmits through polarizing beam-splitter 55, is redirected by retroreflector 64 back to polarizing beam-splitter 55, which transmits it to quarter-wave plate 60B and reflector 56B. Reflector 56B then reflects it back through quarter-wave plate 60B to polarizing beam-splitter 55. The double pass through quarter-wave plate 60B rotates its linear polarization by 90 degrees so that polarizing beam-splitter 55 now reflects it as the reference beam component of a second output beam 26B.

The path of measurement beam 18m through the second HSPMI is as follows. It transmits through polarizing beam-splitter 55 and quarter-wave plate 60D as measurement beam 24A and contacts plane mirror measurement object 70, which reflects it back through quarter-wave plate 60D to polarizing beam-splitter 55. The double pass through quarter-wave plate 60D rotates its linear polarization by 90 degrees so that polarization beam-splitter 55 now reflects it to retroreflector 64, which in turn directs it back to polarizing beam-splitter 55. Polarizing beam-splitter 55 then directs it back through quarter-wave plate 60D as measurement beam 24B to contact plane mirror measurement object 70 a second time, which reflects it back through quarter-wave plate 60D and back to polarizing beam-splitter 55. This second double pass through quarter-wave plate 60D again rotates its linear polarization by 90 degrees so that polarization beam-splitter 55 now transmits it as the measurement beam component of first output beam 26B.

Notably, any spurious beam components of reference beams 18r and 20r and any spurious beam components of measurement beams 18m and 20m that have polarizations orthogonal to the plane of FIG. 1a have minimal effect in generating cyclic errors because such polarization components are trapped in lossy optical cavities. The lossy optical cavities are formed by combinations of polarization beam-splitters 50 and 55, beam-splitters 52A and 52B, and mirrors 54A and 54B, and generate loss during each pass because of beam-splitters 52A and 52B. The spurious beam components can be generated, for example, by finite extinction coefficients for polarizing beam-splitter 50, by misalignment of input beam 14 with respect to planes of polarization, and polarization mixing between the different frequency components in input beam 14.

First output beam 26A includes phase information indicative of changes in distance to plane mirror measurement object 70 along a first measurement axis between measurement beams 22A and 22B. Detector 30A is positioned to measure the intensity of an intermediate polarization component of output beam 26A and sends an electronic signal 40A corresponding to the measurement to electronic processor 80, which extracts the phase information in electronic signal 40A to provide the displacement measurement of the measurement object with respect to the first measurement axis.

Similarly, second output beam 26B includes phase information indicative of changes in distance to plane mirror measurement object 70 along a first measurement axis between measurement beams 24A and 24B. Detector 30B is positioned to measure the intensity of an intermediate polarization component of output beam 26B and sends an electronic signal 40B corresponding to the measurement to electronic processor 80, which extracts the phase information in electronic signal 40B to provide the displacement measurement of the measurement object with respect to the first measurement axis.

The two linear displacements measurements and the separation $b_1$ between the two measurement axes (see FIG. 1a) may be used by electronic processor and computer 80 to compute the angular displacement of plane mirror 70 in the plane of FIG. 1a. The angular displacement is the arctangent of the ratio of $b_1$ and the difference of the two linear displacements.

Figure 1B:
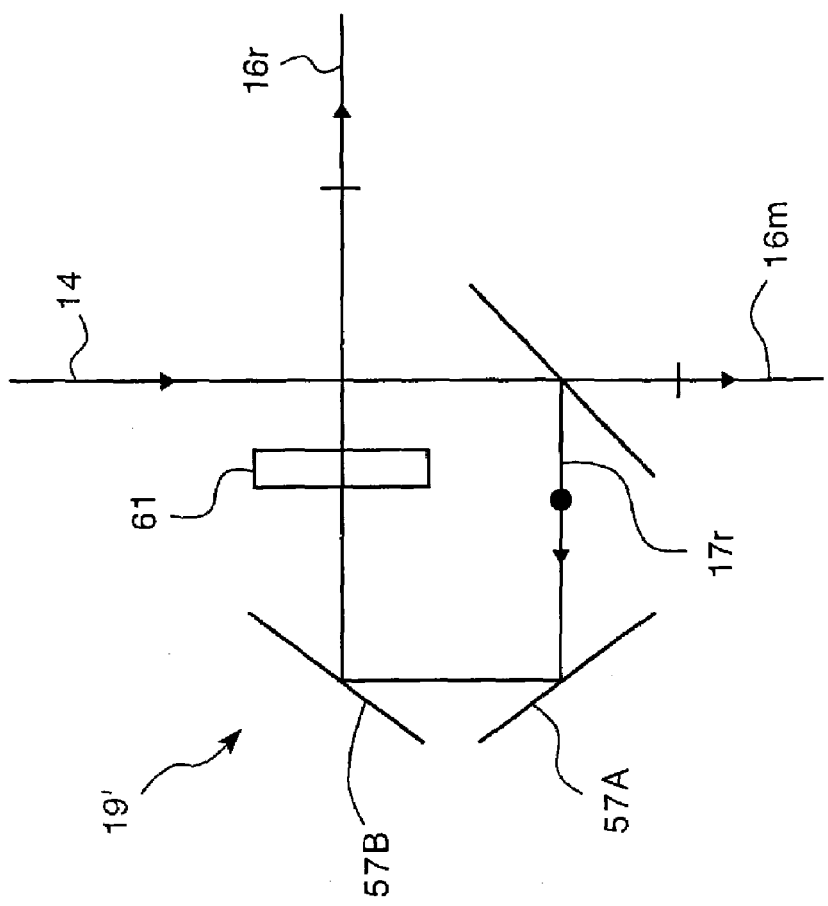
FIG. 1b is a schematic diagram of an alternative set of components for the first embodiment.

Variations of the first embodiment may implement polarization modification optics different from those of polarization optics 19 in FIG. 1a. For example, rather than double-passing quarter-wave plate 60A to rotate the linear polarization of beam 17r, a single pass through a half-wave plate may be used. Such an arrangement is shown in FIG. 1b, where polarization optics 19' including a pair of reflectors 57A and 57B and a half-wave retarder 61. The reflectors redirect beam 17r to make a single pass through half-wave retarder 61, which rotates its linear polarization by 90 degrees, and forms beam 16r. The subsequent manipulation of beams 16r and 16m is as described above.

Figure 2:
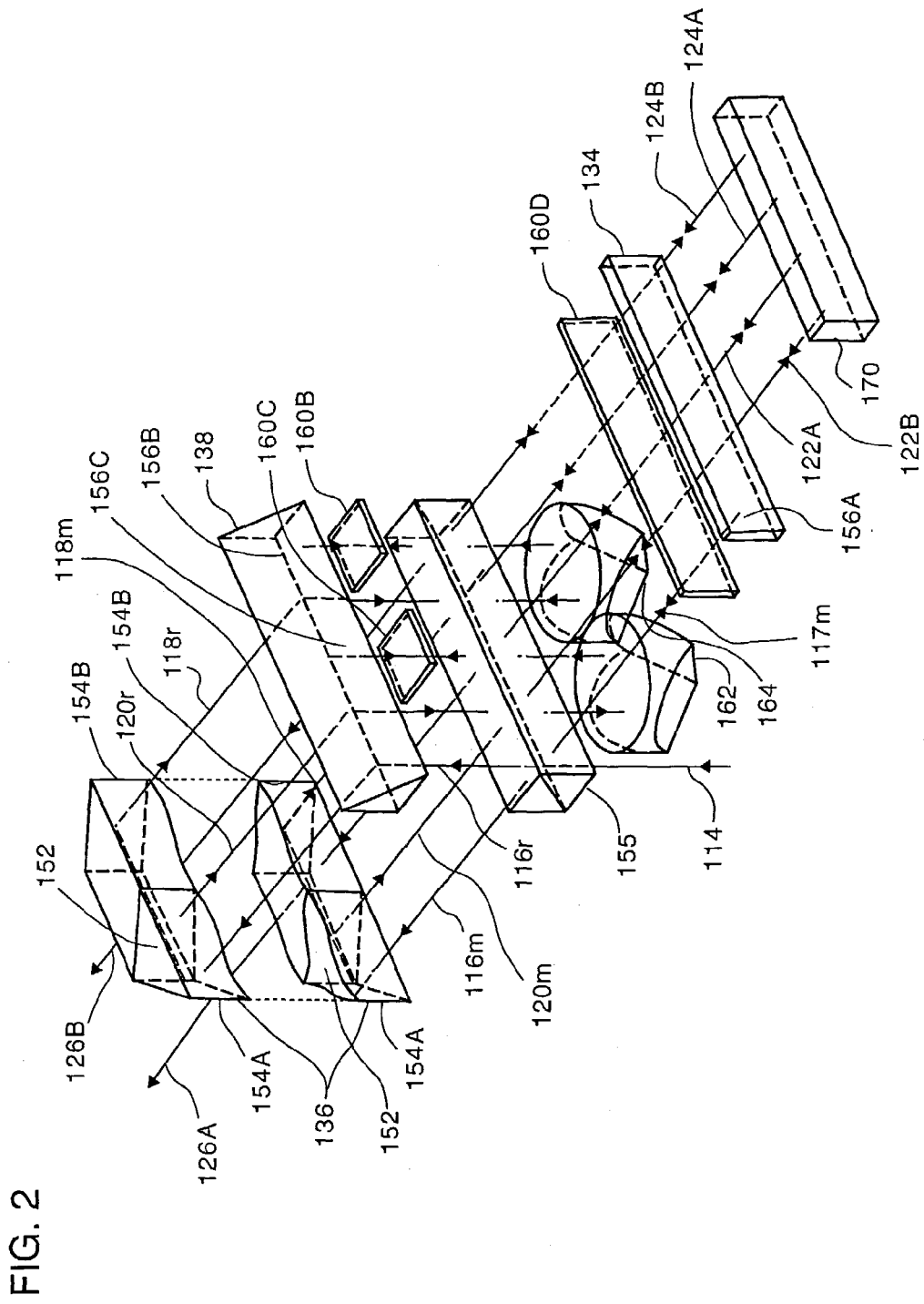
FIG. 2 is a schematic diagram of a second embodiment of an interferometric system.

A second embodiment of the invention is in a diagrammatic perspective view in FIG. 2. The second embodiment is functionally similar to the first embodiment, although the beam paths are no longer coplanar. Furthermore, many of the components in the second embodiment perform the functions corresponding to multiple elements in the first embodiment. Moreover, as illustrated in FIG. 2, the components of the second embodiment can be combined to form a compact integral assembly. In particular, the components of the second embodiment (except for plane mirror measurement object 170) are shown in an exploded view in FIG. 2, and can be attached to one another by, for example, adhesive or optical contacting. Like the first embodiment, the second embodiment is also structured to reduce some sources of cyclic errors.

Like the first embodiment, the second embodiment includes two high stability plane mirror interferometer (HSPMI) systems that share a common set of interferometer optics for measuring changes in the position of a plane mirror measurement object 170 with respect to multiple degrees of freedom. Optics positioned prior to the interferometer optics are configured to separate an input beam into two sets of spatially separated measurement and reference beams, each of which is then directed to a corresponding one of the HSPMI systems.

Referring to FIG. 2, the first HSPMI system includes a polarizing beam-splitter 155, a first retroreflector 162, a first reference mirror 156C, a first reference quarter-wave plate 160C, a measurement quarter-wave plate 160D, and a detector (not shown). The second HSPMI system includes polarizing beam-splitter 155, a second retroreflector 164, a second reference mirror 156B, a second reference quarter-wave plate 160B, measurement quarter-wave plate 160D, and a detector (not shown). Reference mirrors 156C and 156B correspond to reflective coatings on the underside of a roof prism 138. An optical window 134 functions as a backing plate for securing measurement quarter-wave plate 160D to polarizing beam-splitter 155.

An input beam 114 like that of the first embodiment is incident on a polarizing beam-splitter 155, which separates it into two orthogonally polarized beams 116r and 117m that correspond to the orthogonally polarized components of the input beam that have different frequencies. Beam 117m then passes through quarter-wave plate 160D and reflects from reflective region 156A of optical window 134 to pass back through quarter-wave plate 160D to polarizing beam-splitter 155. The double-pass through quarter-wave plate 160D rotates the linear polarization of beam 117m by 90 degrees so that polarizing beam-splitter 155 transmits it to define beam 116m. Reflective region 156A and the portion of quarter-wave plate 160D that passes beam 117m correspond to the polarization modification optics 19 of the first embodiment.

Following a reflection of beam 116r by roof prism 138, beams 116m and 116r propagate parallel to one another and have the same linear polarization. Beams 116m and 116r are then incident on a non-polarizing beam-splitting assembly 136, which includes non-polarizing beam-splitting interface 152 and reflective interfaces 154A and 154B to separate beam 116m into measurement beams 118m and 120m and separate beam 116r into reference beams 118r and 120r. Beams 120m and 120r are the measurement and reference beams, respectively, for the first HSPMI, and beams 118m and 118r are the measurement and reference beams, respectively, for the second HSPMI. As in the first embodiment, each set of reference and measurement beams are spatially separated upon entering their respective HSPMI.

The path of reference beam 120r through the first HSPMI of the second embodiment is as follows. It reflects from roof prism 138 down to polarizing beam-splitter 155, which transmits it to retroreflector 162, which redirects it back to polarizing beam-splitter 155, which transmits it to quarter-wave plate 160C and reflector 156C. Reflector 156C then reflects it back through quarter-wave plate 160C to polarizing beam-splitter 155. The double pass through quarter-wave plate 160C rotates its linear polarization by 90 degrees so that polarizing beam-splitter 155 now reflects it as the reference beam component of a first output beam 126A.

The path of measurement beam 120m through the first HSPMI of the second embodiment is as follows. It transmits through polarizing beam-splitter 50, quarter-wave plate 160D, and optical window 134 as measurement beam 122A and contacts plane mirror measurement object 170, which reflects it back through optical window 134 and quarter-wave plate 160D to polarizing beam-splitter 155. The double pass through quarter-wave plate 160D rotates its linear polarization by 90 degrees so that polarization beam-splitter 155 now reflects it to retroreflector 162, which in turn directs it back to polarizing beam-splitter 155. Polarizing beam-splitter 155 then directs it back through quarter-wave plate 160D as measurement beam 122B to contact plane mirror measurement object 170 a second time, which reflects it back through quarter-wave plate 160D and back to polarizing beam-splitter 155. This second double pass through quarter-wave plate 160D again rotates its linear polarization by 90 degrees so that polarization beam-splitter 155 now transmits it as the measurement beam component of first output beam 126A. Output beam 126A exits the interferometer by passing through a transparent portion of non-polarizing beam-splitting assembly 136.

The paths of reference and measurement beams 118r and 118m, respectively, through the second HSPMI of the second embodiment are similar to those of reference and measurement beams 120r and 120m, respectively, in the first HSPMI of the second embodiment, and are described below for completeness.

The path of reference beam 118r through the second HSPMI of the second embodiment is as follows. It reflects from roof prism 138 down to polarizing beam-splitter 155, which transmits it to retroreflector 164, which redirects it back to polarizing beam-splitter 155, which transmits it to quarter-wave plate 160B and reflector 156B. Reflector 156B then reflects it back through quarter-wave plate 160B to polarizing beam-splitter 155. The double pass through quarter-wave plate 160B rotates its linear polarization by 90 degrees so that polarizing beam-splitter 155 now reflects it as the reference beam component of a first output beam 126B.

The path of measurement beam 118m through the second HSPMI of the second embodiment is as follows. It transmits through polarizing beam-splitter 50, quarter-wave plate 160D, and optical window 134 as measurement beam 124A and contacts plane mirror measurement object 170, which reflects it back through optical window 134 and quarter-wave plate 160D to polarizing beam-splitter 155. The double pass through quarter-wave plate 160D rotates its linear polarization by 90 degrees so that polarization beam-splitter 155 now reflects it to retroreflector 164, which in turn directs it back to polarizing beam-splitter 155. Polarizing beam-splitter 155 then directs it back through quarter-wave plate 160D as measurement beam 124B to contact plane mirror measurement object 170 a second time, which reflects it back through quarter-wave plate 160D and back to polarizing beam-splitter 155. This second double pass through quarter-wave plate 160D again rotates its linear polarization by 90 degrees so that polarization beam-splitter 155 now transmits it as the measurement beam component of first output beam 126B.

Information about changes in the position of plane mirror measurement object 170 along multiple degrees of freedom are derived from output beam 126A and 126B in the same manner as that described above for the first embodiment. To provide thermal stability, the relative glass thicknesses of polarizing beam splitter 155, roof prism 138, and optical window 134 are set to insure equal path lengths in glass for the different components of each output beams.

As mentioned above, the second embodiment uses common elements to provide the functions corresponding to multiple elements in the first embodiment. For example, the function of polarizing beam-splitters 50 and 55 from the first embodiment correspond to different regions of a common polarizing beam-splitter (polarizing beam-splitter 155) in the embodiment of FIG. 2. Similarly, for example, the functions of non-polarizing beam splitters 52A and 52B and reflectors 54A and 54B from the first embodiment correspond to non-polarizing beam-splitting assembly 136 in the second embodiment, and the functions of quarter wave plates 60A and 60D from the first embodiment correspond to a common quarter-wave plate (quarter-wave plate 160D) in the second embodiment.

Furthermore, the second embodiment has a reduced number of sensitive alignments for elements as compared to the first embodiment of the present invention. The sensitive alignments of elements of the second embodiment are the alignment of the hypotenuse of roof prism 138, the mirror portions 160B and 160C of roof prism 138, and the mirror portion 156A of optical window 134. Angle $\alpha_2$ between the hypotenuse of prism 138 and the mirror portions 160B and 160C of prism 138 in the plane of FIG. 2 and angle $\beta_2$ between the mirror portions 160B and 160C of prism 138 and the mirror portion 156A of optical window 134 in the plane of FIG. 2 are related according to the formula $$\alpha_2 = \frac{\beta_2}{2}. \tag{1}$$

With respect to the corresponding sensitive alignment out of the plane of FIG. 2, vectors normal to the surfaces of the hypotenuse of roof prism 138, the mirror 160B and 160C portions of prism 138, and the mirror portion 156A of element 134 each lie in planes that are coplanar with the plane of FIG. 2.

Figure 3:
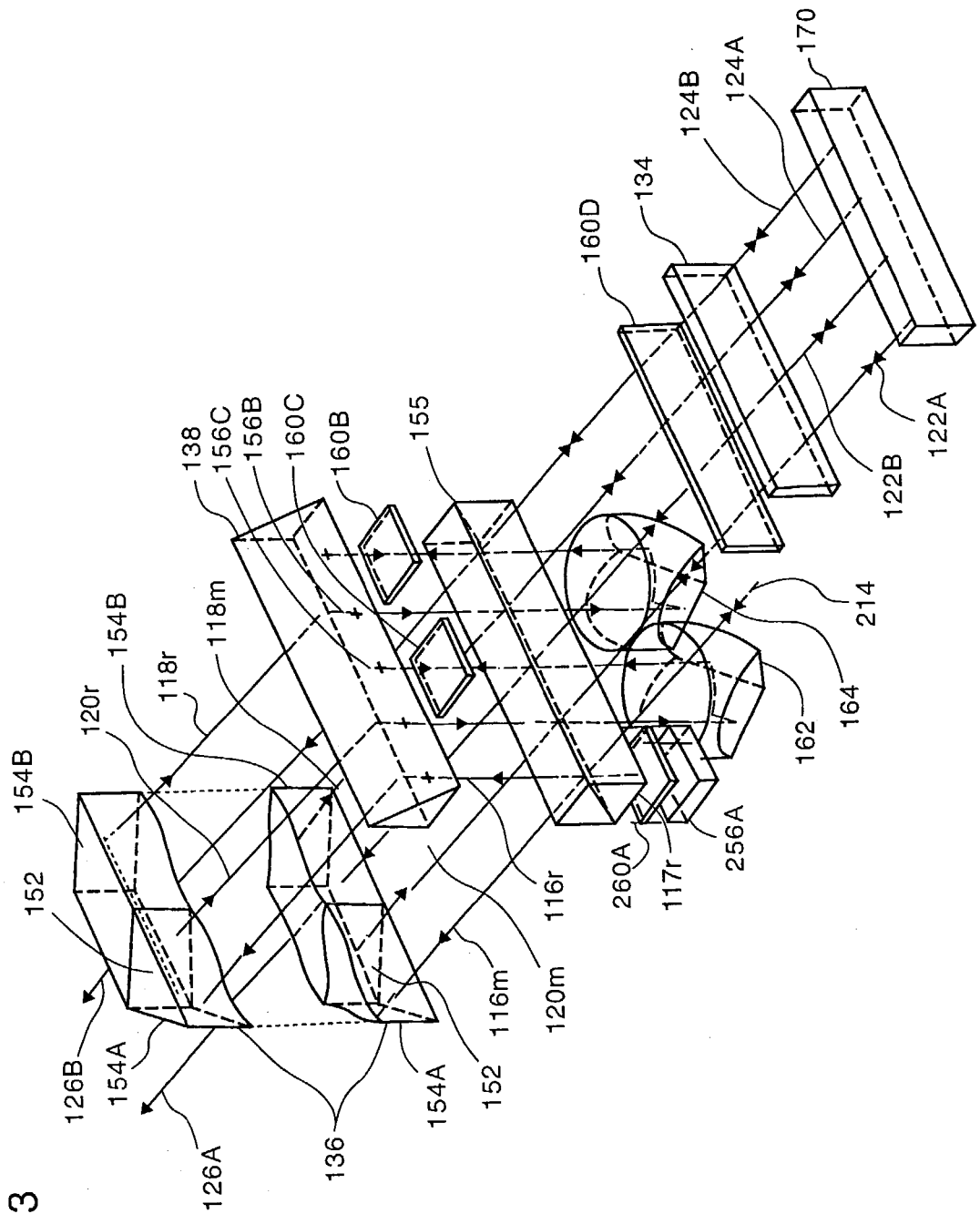
FIG. 3 is a schematic diagram of a third embodiment of an interferometric system.

A third embodiment is shown in a diagrammatic perspective view in FIG. 3. The third embodiment is very similar to the second embodiment and includes many elements of the second embodiment. Elements of the third embodiment that have the same element numbers of the elements of the second embodiment perform the same functions. The main difference between the second and third embodiments is that the input beam (input beam 214) enters the system from a different direction and that a somewhat different arrangement of optics is used to generate beams 116r and 116m, as will now be described.

Input beam 214, which is like that of the first embodiment is incident on a polarizing beam-splitter 155, which separates it into two orthogonally polarized beams 116m and 117r that correspond to the orthogonally polarized components of the input beam that have different frequencies. Beam 117r then passes through quarter-wave plate 260A and reflects from reflector 256A to pass back through quarter-wave plate 260A to polarizing beam-splitter 155. The double-pass through quarter-wave plate 260A rotates the linear polarization of beam 117r by 90 degrees so that polarizing beam-splitter 155 transmits it to define beam 116r. Reflector 256A and quarter-wave plate 260A correspond to the polarization modification optics 19 of the first embodiment. Beams 116r and 116m propagate through the rest of the system in an identical manner to that in the second embodiment.

In a variation of either of the second and third embodiments, non-polarizing beam-splitting assembly 136 can be separated into two smaller assemblies, a lower measurement beam assembly for receiving beam 116m and generating measurement beams 118m and 120m and an upper reference beam assembly for receiving beam 116r and generating reference beams 118r and 120r. Furthermore, roof prism 138 can be removed and the reference beam assembly can be positioned in its place to directly receive beam 116r from polarizing beam-splitter 155 and generate reference beams 118r and 120r. In such arrangements, reflective coatings 156B and 156C are applied directly to appropriate regions of the reference beam assembly.

In further embodiments of the interferometer system, the system may produce more than two output beams to provide information about changes in the position of the measurement object with respect to additional degrees of freedom. For example, in any of the embodiments described above, an additional non-polarizing beam-splitting assembly may be positioned prior to the system to split the input beam into two. The second input beam and beams derived from it propagate through the system just as the original input beam and the beams derived from it, except in a plane or planes displaced from them.

Referring to the first embodiment, for example, a non-polarizing beam-splitting assembly may be positioned to separate a portion of input beam 14 to produce a second input beam that propagates parallel to input beam 14 but in a second plane above or below that of FIG. 1*a* to produce a second set of output beams that provide information about changes in distance to the measurement object with respect to measurement axes in that second plane.

Figure 4B:
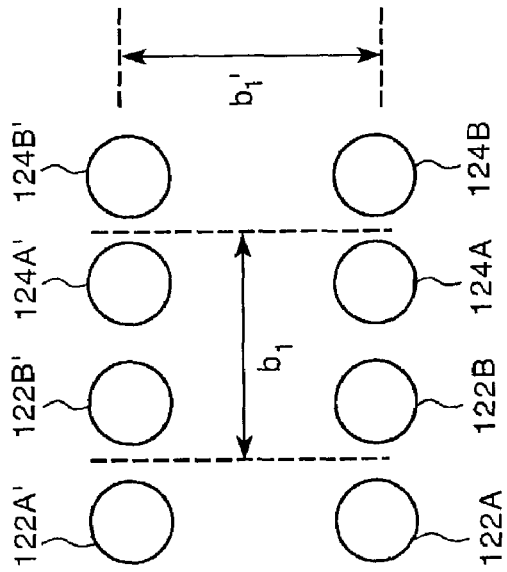
FIGS. 4a and 4b is a schematic diagram of a fourth embodiment of an interferometric system.
Figure 4A:
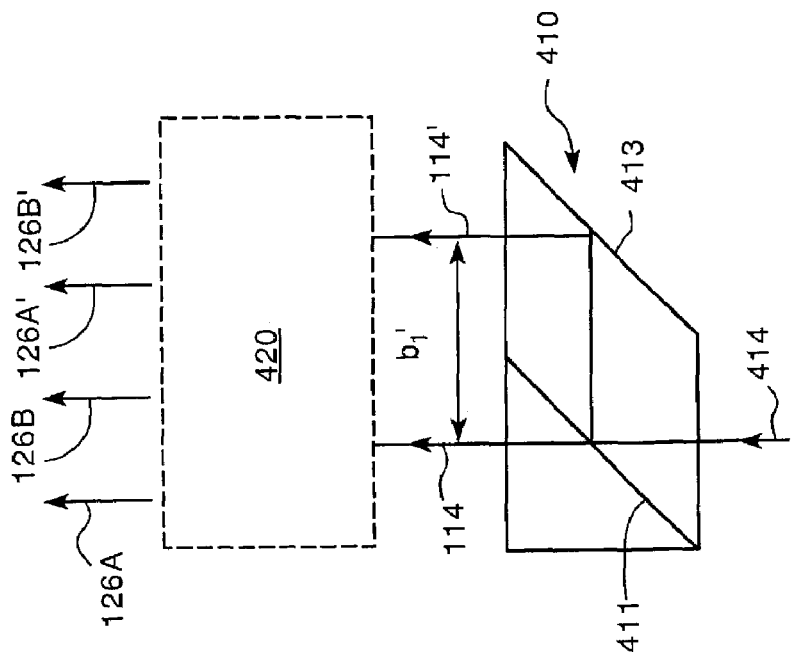

In another example, a similar approach is used to modify the second embodiment to produce a fourth embodiment. Referring to FIG. 4*a*, a non-polarizing beam-splitting assembly 410, which includes a non-polarizing beam-splitting interface 411 and a reflector 413, is positioned to receive a progenitor input beam 414. Non-polarizing beam-splitting interface 411 transmits a first portion of the progenitor input beam to produce the input beam 114, and reflects a second portion, which is then reflected by reflector 413 to produce a second input beam 114'. Input beams 114 and 114' propagate parallel to one another along the z-axis and are displaced from one another by the distance $b_1'$ in the y-z plane, where, referring back to FIG. 2, the x-axis extends parallel to the length of polarizing beam-splitter 150, the y-axis extends parallel to measurement beams 122A, 122B, 124A, and 124B, and the z-axis extends parallel to input beam 114. Beams 114 and 114' are then incident on interferometer system 420, which is identical to that of FIG. 2 except that retro-reflectors 162 and 164, which are depicted in FIG. 2 as being of the corner-cube type, are replaced by a two-mirror type of retro-reflector, like those of retro-reflectors 62 and 64 depicted in FIG. 1*a*. Input beam 114 and beams derived from it propagate through interferometer system 420 just as in the second embodiment of FIG. 2 to produce output beams 126A and 126B, and input beam 114' propagates through the interferometer system in a likewise fashion (but for the displacement by the distance $b_1'$) to produce output beams 126A' and 126B'. FIG. 4*b* is a cross-section view in the x-z plane depicting measurement beams 122A, 122B, 124A, and 124B, which are derived from input beam 114, and corresponding measurement beams 122A', 122B', 124A', and 124B' derived from input beam 114'. Using knowledge of the distance $b_1'$, and displacement information derived from one of the output beams derived from input beam 114 and one of the output beams derived from input beam 114', the electronic processor can determine changes in the angular orientation of the measurement object with respect to a rotation axis parallel to the x-axis (in addition to such angular orientation information already determined as in the second embodiment, which is with respect to a rotation axis parallel to the z-axis). Moreover, the measurement beams associated with the other one of the output beams derived from input beam 114' may be redirected to a second mirror surface of the measurement object to provide additional information about changes in the angular orientation of the measurement object, where the second mirror surface is oriented parallel to the plane of plane mirror measurement object 170.

Further embodiments of the present invention can be configured to measure at least two degrees of freedom including a linear displacement and an angular displacement wherein the angular displacement is obtained by optical differencing without departing from the scope and spirit of the present invention. Examples of configurations using optical differencing are described in, for example, an article entitled "Differential interferometer arrangements for distance and angle measurements: Principles, advantages and applications" by C. Zanoni, *VDI Berichte* Nr. 749, 93–106 (1989). Embodiments of optical differencing include directing two beams to different locations on the plane mirror measurement object and then recombining the beams to produce an interferometric phase difference indicative of changes in the angular orientation of the measurement object.

Figure 5:
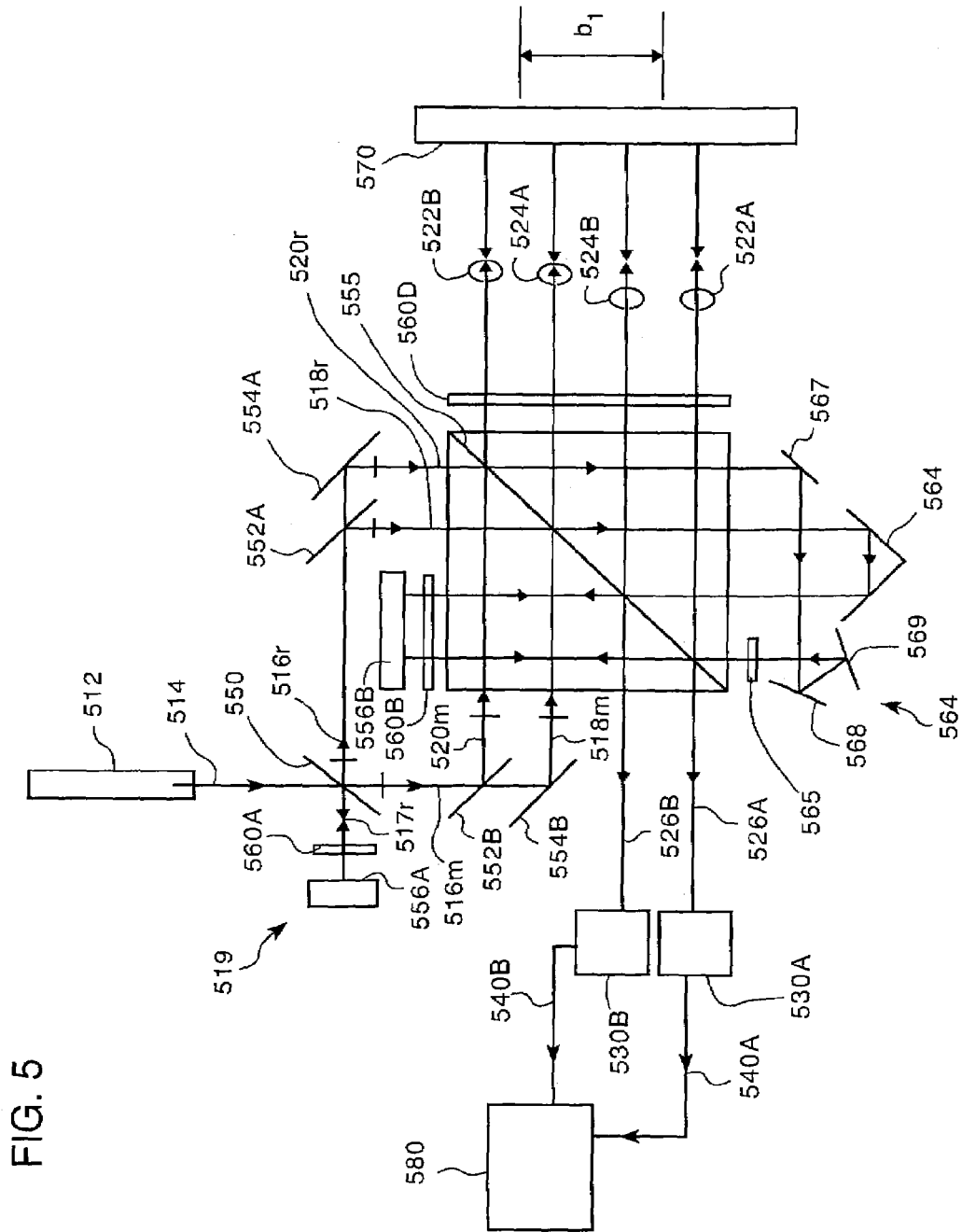
FIG. 5 is a schematic diagram of a fifth embodiment of an interferometric system.

FIG. 5 shows in schematic form a fifth embodiment of the interferometer system, which is similar to the first embodiment except that one of the HSPMIs is replaced with an angle-measuring interferometer based on optical differencing. The HSPMI system includes a polarizing beam-splitter 555, a retroreflector 562, a reference mirror 556B, a reference quarter-wave plate 560B, a measurement quarter-wave plate 560D, and a detector 530A. The angle-measuring interferometer includes polarizing beam-splitter 555, a three-mirror fold assembly 564, a half-wave plate 565, reference mirror 556B, a reference quarter-wave plate 560B, measurement quarter-wave plate 560D, and a detector 530B. Fold assembly 564 comprises reflectors 567, 568, and 569.

An input beam 514 from a source 512 includes two components that are orthogonally polarized and have different frequencies, just as in the first embodiment. A polarizing beam-splitter 550 is positioned to separate input beam 514 into two orthogonally polarized beams 516*m* and 517*r*, which correspond to the orthogonally polarized components of the input beam. It transmits the component of the input beam linearly polarized in the plane of FIG. 5 to define beam 516*m*, which is likewise linearly polarized in the plane of FIG. 5. It reflects the component of the input beam linearly polarized orthogonal to the plane of FIG. 5 to define beam 517*r*, which is likewise linearly polarized orthogonal to the plane of FIG. 5. Beam 517*r* is then incident on polarization modification optics 519, which include a quarter-wave plate 560A and a reflector 556A in sequence. Reflector 556A is oriented to direct beam 517*r* back through quarter-wave plate 560A to polarizing beam-splitter 550. The double-pass through quarter-wave plate 560A rotates the linear polarization of beam 517*r* by 90 degrees so that polarizing beam-splitter 550 transmits it to define beam 516*r*, which like beam 516*m*, is linearly polarized in the plane of FIG. 5.

Referring still to FIG. 5, a first portion of beam 516*r* is transmitted by a non-polarizing beam-splitter 552A as a first angle-measuring beam 520*r*, which is then reflected by reflector 554A to define the first angle-measuring beam for the angle-measuring interferometer. A second portion of beam 516*r* is reflected by non-polarizing beam-splitter 522A as a reference beam 518*r*, which defines the reference beam for the HSPMI.

Similarly, a first portion of beam 516*m* is reflected by non-polarizing beam-splitter 552B as a second angle-measuring beam 520*m*, which defines the second angle-measuring beam for the angle-measuring interferometer. A second portion of beam 516*m* is transmitted by a non-polarizing beam-splitter 552B as a measurement beam 518*m*, which is then reflected by reflector 554B to define the measurement beam for the HSPMI system. Notably, the two angle-measuring beams are spatially separated upon entering the angle-measuring interferometer, and the reference and measurement beams are spatially separated upon entering the HSPMI.

The path of reference beam 518*r* through the HSPMI of the fifth embodiment is as follows. It transmits through polarizing beam-splitter 555, is redirected by retroreflector 564 back to polarizing beam-splitter 555, which transmits it to quarter-wave plate 560B and reflector 556B. Reflector 556B then reflects it back through quarter-wave plate 560B to polarizing beam-splitter 555. The double pass through quarter-wave plate 560B rotates its linear polarization by 90 degrees so that polarizing beam-splitter 555 now reflects it as the reference beam component of a distance-measuring output beam 526B.

The path of measurement beam 518m through the HSPMI of the fifth embodiment is as follows. It transmits through polarizing beam-splitter 555 and quarter-wave plate 560D as measurement beam 524A and contacts plane mirror measurement object 570, which reflects it back through quarter-wave plate 560D to polarizing beam-splitter 555. The double pass through quarter-wave plate 560D rotates its linear polarization by 90 degrees so that polarization beam-splitter 555 now reflects it to retroreflector 564, which in turn directs it back to polarizing beam-splitter 555. Polarizing beam-splitter 555 then directs it back through quarter-wave plate 560D as measurement beam 524B to contact plane mirror measurement object 570 a second time, which reflects it back through quarter-wave plate 560D and back to polarizing beam-splitter 555. This second double pass through quarter-wave plate 560D again rotates its linear polarization by 90 degrees so that polarization beam-splitter 555 now transmits it as the measurement beam component of first output beam 526B.

The path of first-angle measuring beam 520r through the angle-measuring interferometer is as follows. It transmits through polarizing beam-splitter 555, and is then redirected by reflectors 567, 568, and 569 back towards polarizing beam-splitter 555. Before returning to polarizing beam-splitter 555, however, it passes through half-wave retardation plate 565, which is oriented to rotate its linear polarization by 90 degrees. As a result, polarizing beam-splitter 555 then reflects it through quarter-wave plate 560D as angle measurement beam 522A to contact plane mirror measurement object 570, which then reflects it back through quarter-wave plate 560D to polarizing beam-splitter 555. The double pass through quarter-wave plate 560D rotates its linear polarization by 90 degrees so that polarizing beam-splitter 555 now transmits it as a first component of an angle-measuring output beam 526A.

The path of second-angle measuring beam 520m through the angle-measuring interferometer is as follows. It transmits through polarizing beam-splitter 555 and quarter-wave plate 560D as angle measurement beam 522B and contacts plane mirror measurement object 570, which reflects it back through quarter-wave plate 560D to polarizing beam-splitter 555. The double pass through quarter-wave plate 560D rotates its linear polarization by 90 degrees so that polarization beam-splitter 555 now reflects it to reflectors 567, 568, and 569, which in turn directs it back towards polarizing beam-splitter 555. Before returning to polarizing beam-splitter 555, however, it passes through half-wave retardation plate 565, which is oriented to rotate its linear polarization by 90 degrees. As a result, polarizing beam-splitter 555 then transmits it to quarter-wave plate 560B and reflector 556B. Reflector 556B then reflects it back through quarter-wave plate 560B to polarizing beam-splitter 555. The double pass through quarter-wave plate 560B rotates its linear polarization by 90 degrees so that polarizing beam-splitter 555 now reflects it as the second component of angle-measuring output beam 526A.

Distance-measuring output beam 526B includes phase information indicative of changes in distance to plane mirror measurement object 570 along a first measurement axis between measurement beams 524A and 524B. Detector 530B is positioned to measure the intensity of an intermediate polarization component of output beam 526B and sends an electronic signal 540B corresponding to the measurement to electronic processor 580, which extracts the phase information in electronic signal 540B to provide the displacement measurement of the measurement object with respect to the first measurement axis.

Angle-measuring output beam 526A includes phase information indicative of changes in the angle orientation of plane mirror measurement object 570 in the plane of measurement beams 522A and 522B (which corresponds to a rotation about an axis normal to the plane of FIG. 5). Detector 530A is positioned to measure the intensity of an intermediate polarization component of output beam 526A and sends an electronic signal 540A corresponding to the measurement to electronic processor 580, which extracts the phase information in electronic signal 540A to provide the angle measurement. The relationship between such a change in angle $\theta_2$ of the plane mirror measurement object and the phase shift $\phi_2$ between the components of the angle-measuring output beam corresponding to the two angle-measuring beams is as follows:

$$\phi_2 = k_2 n_2 b_2 \theta_2 \quad (2)$$

where $b_2$ is the spacing between the angle-measuring beams on the measurement object (see FIG. 5) at the plane mirror measurement object, wavenumber $k_2 = 2\pi/\lambda_2$ for wavelength $\lambda_2$ of the input beam, and $n_2$ is the index of refraction of a gas in the beam paths.

The series of reflectors 567, 568, and 569 forming fold assembly 565 have the image inverting properties of a single reflecting surface. As a result, the angle-measuring interferometer is configured such that the components of the angle-measuring output beam propagate parallel to one another even when the angle-measuring beams contact the measurement object at non-normal incidence. Moreover, it is configured to reduce the relative beam shear between the components of the angle-measuring output beam within the angular displacement interferometer and at detector 530A. This is because both components of the angle-measuring output beam (which are derived from the angle-measuring beams) undergo substantially equal amounts of shear upon a non-normal reflection from the plane mirror measurement object and subsequent propagation back to the interferometer.

Additional embodiments of the fold assembly for the angle-measuring beams may include other combinations of reflective surfaces to provide the image inverting properties of a single reflecting surface described above. In general, the set of reflective surfaces should reflect the angle-measuring beams such that a sum of angles between incident and reflected beams at each of the reflective surfaces is zero or an integer multiple of 360 degrees, wherein each angle is measured in a direction from the incident beam to the reflected beam and has a positive value when measured in a counter clockwise direction and a negative value when measured in a clockwise direction. In many such embodiments, there are an odd number of reflections from surfaces that have normals in a common plane.

In further embodiments, angle-measuring interferometers may be similarly implemented into the second, third, and fourth embodiments.

Also, in any of the embodiments described above, a fiber optic pick may be used to couple optical information from the output beam to a remote photo-detector.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p 82 (1997).

Overlay depends directly on the performance, i.e. accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6A:
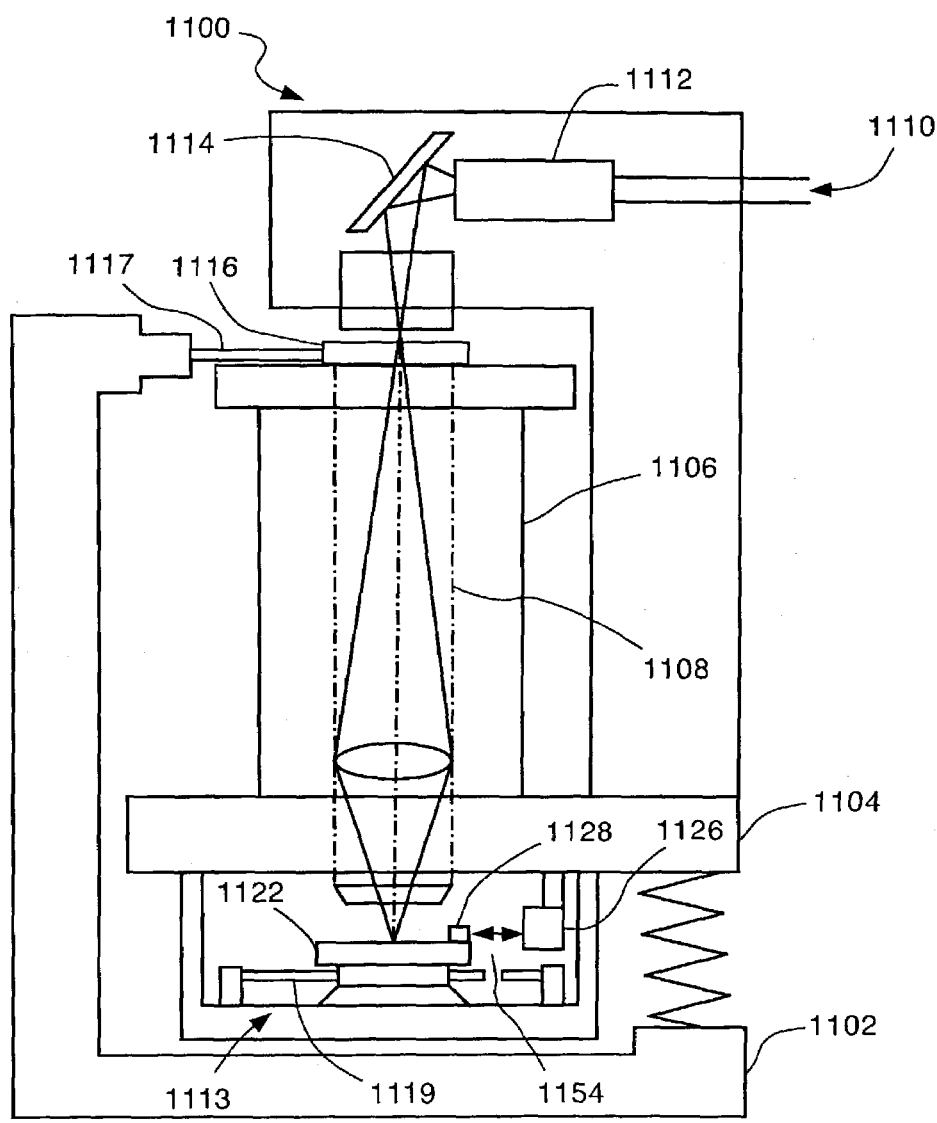
FIG. 6a is a schematic diagram of a lithography system used to make integrated circuits.

An example of a lithography scanner 1100 using an interferometry system 1126 is shown in FIG. 6*a*. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6B:
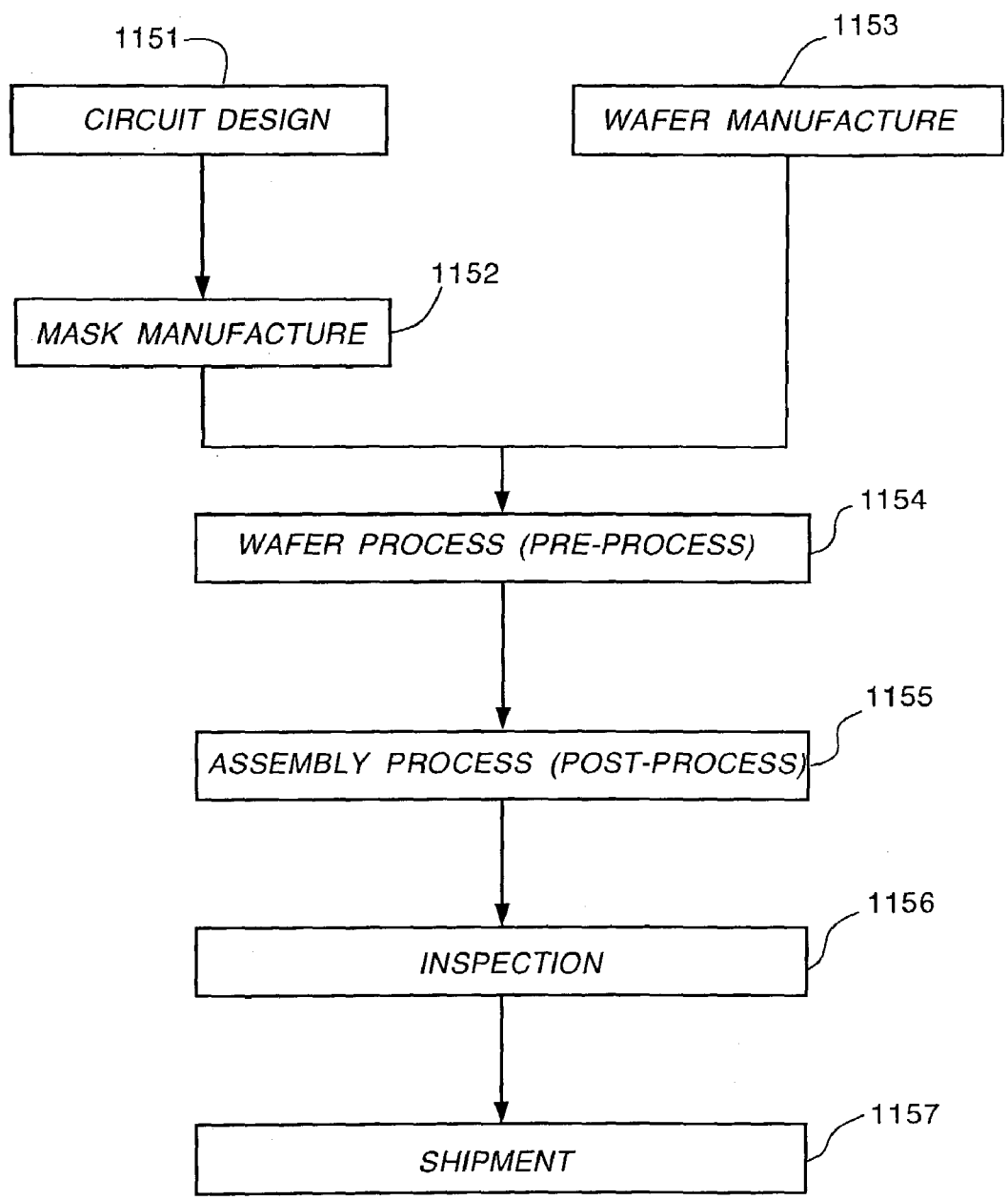
FIGS. 6b–6c are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 6*b* and 6*c*. FIG. 6*b* is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 6C:
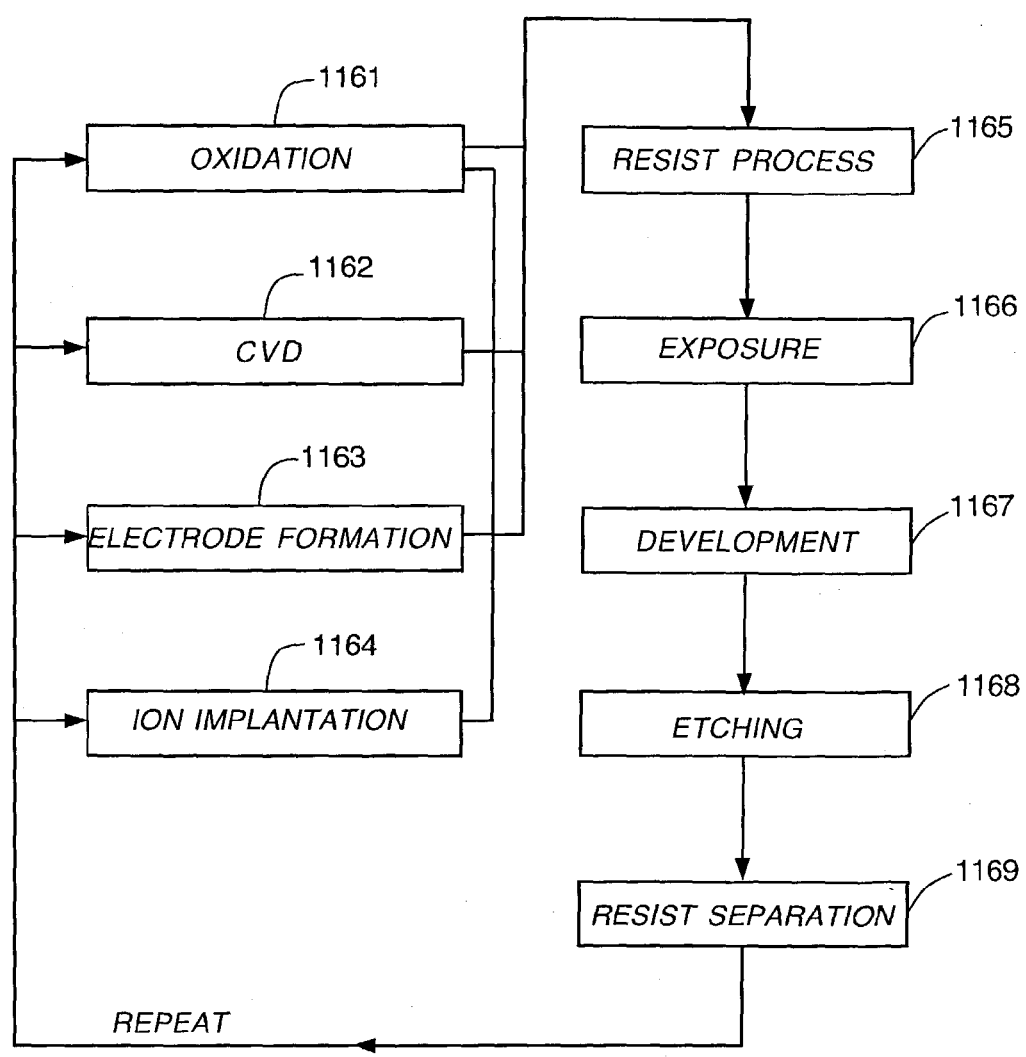

FIG. 6*c* is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
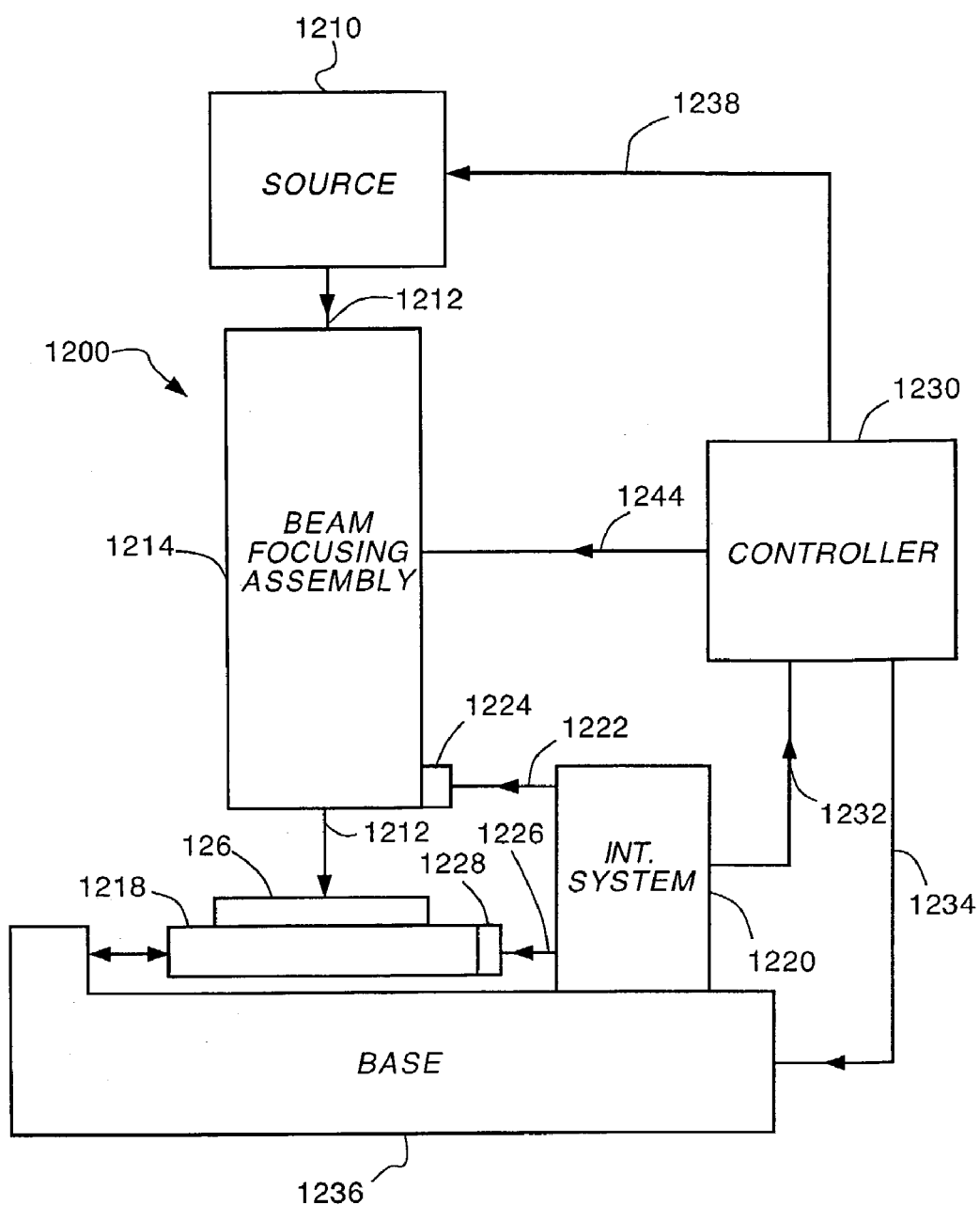
FIG. 7 is a schematic of a beam writing system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. Interferometric apparatus comprising:
    a polarizing beam-splitting interface positioned to separate an input beam into two orthogonally polarized beams;
    interferometer optics positioned to receive a first set of beams derived from one of the orthogonally polarized beams and a second set of beams derived from the other of the orthogonally polarized beams; and
    intermediate optics positioned to derive the first set of beams from one of the orthogonally polarized beams and derive the second set of beams from the other of the orthogonally polarized beams,
    wherein the interferometer optics are configured to direct the beams in the first set to contact different respective locations of a measurement object at least once, and subsequently combine each beam in the first set with a corresponding beam from the second set of beams to produce a corresponding output beam comprising information about changes in the position of the measurement object with respect to a different degree of freedom.

2. The apparatus of claim 1, further comprising a light source for producing the input beam and directing it to the polarizing beam-splitting interface, wherein the light source is configured to generate a frequency splitting suitable for heterodyne detection between the orthogonal polarized components of the input beam.

3. The apparatus of claim 1, wherein each beam from the first set of beams is spatially separated from the corresponding beam from the second set upon entering the interferometer optics.

4. The system of claim 1, wherein the beams in the first and second sets have the same polarization upon entering the interferometer optics.

5. The apparatus of claim 1, wherein one of the output beams comprises information about changes in distance to a first location on the measurement object.

6. The apparatus of claim 5, wherein another of the output beams comprises information about changes in distance to a second location on the measurement object, wherein the second location different from the first location.

7. The apparatus of claim 1, wherein the interferometer optics direct at least one of the beams from the first set to contact the measurement object at least twice before it is combined with the corresponding beam from the second set.

8. The apparatus of claim 1, wherein at least one of the output beams comprises information about changes in an angular orientation of the measurement object with respect to a first rotation axis.

9. The apparatus of claim 1, wherein the interferometer optics direct at least one of the beams from the first set to contact the measurement object only once and direct the corresponding beam from the second set to likewise contact the measurement object only once, but at a location different from that of the one beam in the first set, and prior to combining it with the one beam in the first set.

10. The apparatus of claim 1, wherein the measurement object comprises a plane mirror.

11. A lithography system for use in fabricating integrated circuits on a wafer, the system comprising:
    a stage for supporting the wafer;
    an illumination system for imaging spatially patterned radiation onto the wafer;
    a positioning system for adjusting the position of the stage relative to the imaged radiation; and
    the apparatus of claim 1 for monitoring the position of the wafer relative to the imaged radiation.

12. A method for fabricating integrated circuits, the method comprising using the lithography apparatus of claim 11.

13. A lithography system for use in fabricating integrated circuits on a wafer, the system comprising:
    a stage for supporting the wafer; and
    an illumination system including a radiation source, a mask, a positioning system, a lens assembly, and the apparatus of claim 1,
    wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

14. A method for fabricating integrated circuits, the method comprising using the lithography apparatus of claim 13.

15. A beam writing system for use in fabricating a lithography mask, the system comprising:
    a source providing a write beam to pattern a substrate;
    a stage supporting the substrate;
    a beam directing assembly for delivering the write beam to the substrate;
    a positioning system for positioning the stage and beam directing assembly relative one another; and
    the apparatus of claim 1 for monitoring the position of the stage relative to the beam directing assembly.

16. The apparatus of claim 1, wherein the intermediate optics comprise a pair of non-polarizing beam splitters, one for the first set of beams and the other for the second set of beams.

17. Interferometric apparatus comprising:
    a polarizing beam-splitting interface positioned to separate an input beam into two orthogonally polarized beams; and
    interferometer optics positioned to receive a first set of beams derived from one of the orthogonally polarized beams and a second set of beams derived from the other of the orthogonally polarized beams,
    wherein the interferometer optics are configured to direct the beams in the first set to contact different respective locations of a measurement object at least once, and subsequently combine each beam in the first set with a corresponding beam from the second set of beams to produce a corresponding output beam comprising information about changes in the position of the measurement object with respect to a different degree of freedom,
    wherein the interferometer optics are configured to produce more than two output beams, each of which provides information about changes in the position of the measurement object with respect to a different degree of freedom.

18. The apparatus of claim 17, further comprising a non-polarizing, input beam-splitting assembly configured to separate a progenitor input beam into the first-mentioned input beam and a parallel propagating second input beam spatially separated from the first input beam, and wherein the input beam-splitting assembly is further configured to direct the spatially separated first and second input beams to the polarizing beam-splitter interface, wherein the polarizing beam-splitting interface is positioned to separate the second input beam into a second set of two orthogonally polarized beams; and wherein interferometer optics are positioned to receive a third set of beams derived from one of the second set of orthogonally polarized beams and a fourth set of beams derived from the other of the second set of othogonally polarized beams, wherein the interferometer optics are configured to direct each beam in the third set of beams to contact different locations of a measurement object at least once, and subsequently combine each beam from the third set of beams with a corresponding beam from the fourth set of beams to produce a corresponding output beam comprising information about changes in the position of the measurement object with respect to a different degree of freedom.

19. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 17 for monitoring the position of the wafer relative to the imaged radiation.

20. A method for fabricating integrated circuits, the method comprising using the lithography apparatus of claim 19.

21. A lithography system for use in fabricating integrated circuits on a wafer, the system comprising:
a stage for supporting the wafer; and
an illumination system including a radiation source, a mask, a positioning system, a lens assembly, and the apparatus of claim 17,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

22. A method for fabricating integrated circuits, the method comprising using the lithography apparatus of claim 21.

23. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 17 for monitoring the position of the stage relative to the beam directing assembly.

24. Interferometric apparatus comprising:
a polarizing beam-splitting interface positioned to separate an input beam into two orthogonally polarized beams; and
interferometer optics positioned to receive a first set of beams derived from one of the orthogonally polarized beams and a second set of beams derived from the other of the orthogonally polarized beams,
wherein the interferometer optics are configured to direct the beams in the first set to contact different respective locations of a measurement object at least once, and subsequently combine each beam in the first set with a corresponding beam from the second set of beams to produce a corresponding output beam comprising information about changes in the position of the measurement object with respect to a different degree of freedom,
further comprising polarization modification optics positioned to receive a first one of the orthogonally polarized beams and produce a modified polarized beam having a polarization orthogonal to that of the first polarized beam.

25. The apparatus of claim 24, wherein the polarization modification optics comprise a retarder and at least one reflector.

26. The apparatus of claim 25, wherein the retarder and the reflector are in sequence, and the reflector is positioned to direct the first polarized beam beam back through the retarder to the polarizing beam splitter to define the modified polarized beam.

27. The apparatus of claim 26, wherein the retarder is a quarter wave retarder.

28. The apparatus of claim 25, wherein the retarder is a half-wave retarder positioned to receive the first polarized beam and produce the modified polarized beam, and wherein the at least one reflector comprises a pair of reflectors.

29. The apparatus of claim 24, wherein the first set of beams are derived from the modified polarized beam.

30. The apparatus of claim 24, wherein the second set of beams are derived from the modified polarized beam.

31. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 24 for monitoring the position of the wafer relative to the imaged radiation.

32. A method for fabricating integrated circuits, the method comprising using the lithography apparatus of claim 31.

33. A lithography system for use in fabricating integrated circuits on a wafer, the system comprising:
a stage for supporting the wafer; and
an illumination system including a radiation source, a mask, a positioning system, a lens assembly, and the apparatus of claim 24,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

34. A method for fabricating integrated circuits, the method comprising using the lithography apparatus of claim 33.

35. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 24 for monitoring the position of the stage relative to the beam directing assembly.

36. Interferometric apparatus comprising:
a polarizing beam-splitting interface positioned to separate an input beam into two orthogonally polarized beams; and
interferometer optics positioned to receive a first set of beams derived from one of the orthogonally polarized beams and a second set of beams derived from the other of the orthogonally polarized beams,
wherein the interferometer optics are configured to direct the beams in the first set to contact different respective locations of a measurement object at least once, and subsequently combine each beam in the first set with a corresponding beam from the second set of beams to produce a corresponding output beam comprising information about changes in the position of the measurement object with respect to a different degree of freedom,
further comprising non-polarizing beam-splitting optics positioned to generate the first and second sets of beams from the two orthogonally polarized beams.

37. The apparatus of claim 36, wherein the non-polarizing beam-splitting optics comprises a first non-polarizing beams splitting interface positioned to generate at least two of the first set of beams and a second non-polarizing beam-splitting interface positioned to generate at least two of the second set of beams.

38. The apparatus of claim 37, wherein the non-polarizing beam-splitting optics further comprise at least one reflector for causing the beams from the first set to be parallel to one another upon entering the interferometer optics.

39. The apparatus of claim 38, wherein the non-polarizing beam-splitting optics further comprise at least one reflector for causing the beams from the second set to be parallel to one another upon entering the interferometer optics.

40. A lithography system for use in fabricating integrated circuits on a wafer, the system comprising:
a stage far supporting the wafer;
an illumination system for imaging spatially patterned radiation onto the wafer;
a positioning system for adjusting the position of the stage relative to the imaged radiation; and
the apparatus of claim 36 for monitoring the position of the wafer relative to the imaged radiation.

41. A method for fabricating integrated circuits, the method comprising using the lithography apparatus of claim 40.

42. A lithography system for use in fabricating integrated circuits on a wafer, the system comprising:
a stage for supporting the wafer; and
an illumination system including a radiation source, a mask, a positioning system, a lens assembly, and the apparatus of claim 36,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

43. A method for fabricating integrated circuits, the method comprising using the lithography apparatus of claim 42.

44. A beam writing system for use in fabricating a lithography mask, the system comprising:
a source providing a write hewn to pattern a substrate;
a stage supporting the substrate;
a beam directing assembly for delivering the write beam to the substrate;
a positioning system for positioning the stage and beam directing assembly relative one another; and
the apparatus of claim 36 for monitoring the position of the stage relative to the beam directing assembly.

45. Interferometric apparatus comprising:
a polarizing beam-splitting interface positioned to separate an input beam into two orthogonally polarized beams; and
interferometer optics positioned to receive a first set of beams derived from one of the orthogonally polarized beams and a second set of beams derived from the other of the orthogonally polarized beams,
wherein the interferometer optics are configured to direct the beams in the first set to contact different respective locations of a measurement object at least once, and subsequently combine each beam in the first set with a corresponding beam from the second set of beams to produce a corresponding output beam comprising information about changes in the position of the measurement object with respect to a different degree of freedom,
further comprising a second polarizing beam-splitting interface positioned in the interferometer optics.

46. The apparatus of claim 45, further comprising a first polarizing beam-splitter optic defining the first-mentioned polarizing beam-splitter interface, and a second polarizing beam splitter optic in the interferometer optics defining the second polarizing beam-splitter interface.

47. The apparatus of claim 45, further comprising a common polarizing beam-splitter optic defining the first-mentioned polarizing beam-splitting interface and the second polarizing beam-splitting interface.

48. The apparatus of claim 45, wherein the interferometer optics further comprise a quarter wave retarder positioned between the second polarizing beam-splitting interface and the measurement object.

49. The apparatus of claim 48, wherein the interferometer optics further comprises a reference mirror and a quarter wave retarder positioned between the second polarizing beam-splitting interface and the reference mirror, and wherein the second polarizing beam-splitting interface is positioned to direct each beam in the second set to contact the reference mirror at least once.

50. The apparatus of claim 49, wherein the interferometer optics further comprise fold optics positioned to receive from the second polarizing beam-splitting interface the first set of beams after they contact the measurement object for a first time and the second set of beams after they contact the reference mirror for a first time and subsequently direct the first and second sets of beams back to the second polarizing beam-splitting interface.

51. The apparatus of claim 50, wherein upon receiving the first and second sets of beams from the fold optics, the second polarizing beam-splitting interface is configured to direct each beam in the first set of beams to contact the measurement object for a second time and each beam in the second set of beams to contact the reference mirror for a second time.

52. The apparatus of claim 50, wherein the fold optics comprise a retarder positioned to receive a first one of the beams in the first set and the corresponding beam from the second set and rotate their respective polarizations by about 90 degrees before they return to the second polarizing beam-splitting interface.

53. The apparatus of claim 52, wherein upon receiving the first and second sets of beams from the fold optics including the retarder, the second polarizing beam-splitting interface is configured to direct the first beam from the first set of beams to contact the reference mirror and direct the corresponding beam in the second set to contact the measurement object.

54. The apparatus of claim 52, wherein the retarder is a half-wave retarder.

55. The apparatus of claim 52, wherein the fold optics are configured to reflect the first beam from the first set and the corresponding beam from the second set an odd number of times from surfaces that have normal directions in a common plane when directing them back to the second polarizing beam-splitting interface.

56. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the apparatus of claim 45 for monitoring the position of the wafer relative to the imaged radiation.

57. A method for fabricating integrated circuits, the method comprising using the lithography apparatus of claim 56.

58. A lithography system for use in fabricating integrated circuits on a wafer, the system comprising:
a stage for supporting the wafer; and
an illumination system including a radiation source, a mask, a positioning system, a lens assembly, and the apparatus of claim 45,
wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

59. A method for fabricating integrated circuits, the method comprising using the lithography apparatus of claim 58.

60. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the apparatus of claim 45 for monitoring the position of the stage relative to the beam directing assembly.

61. An interferometric method comprising:
separating an input beam into two orthogonally polarized beams;
deriving a first set of beams from one of the orthogonally polarized beams;
deriving a second set of beams from the other of the orthogonally polarized beams;
directing the beams from the first set of beams to contact different respective locations of a measurement object at least once; and
subsequently combining each beam in the first set with a corresponding beam from the second set of beams to produce a corresponding output beam comprising information about changes in the position of the measurement object with respect to a different degree of freedom,
wherein intermediate optics are used for the deriving steps and interferometer optics are used for the directing and combining steps.

62. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 61.

63. A method for fabricating integrated circuits, the method comprising the lithography method of claim 62.

64. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 61; and
imaging the spatially patterned radiation onto a wafer.

65. A method for fabricating integrated circuits, the method comprising the lithography method of claim 64.

66. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 61.

67. A method for fabricating integrated circuits, the method comprising the lithography method of claim 66.

68. A method for fabricating a lithography mask, the method comprising:
directing a write beam to a substrate to pattern the substrate;
positioning the substrate relative to the write beam; and
monitoring the position of the substrate relative to the write beam using the interferometry method of claim 61.

* * * * *

UNITED STATES PATENT AND TRADEMARK OFFICE
CERTIFICATE OF CORRECTION

PATENT NO. : 7,057,739 B2
APPLICATION NO. : 10/364300
DATED : June 6, 2006
INVENTOR(S) : Henry A. Hill Page 1 of 1

It is certified that error appears in the above-identified patent and that said Letters Patent is hereby corrected as shown below:

<u>Column 18</u>
Line 18, replace "$\phi_2$" with -- $\varphi_2$ --
Line 22, replace "$\phi_2 = k_2 n_2 b_2 \theta_2$" with -- $\varphi_2 = k_2 n_2 b_2 \theta_2$ --

<u>Column 26</u>
Line 28, delete the second occurrence of "beam"

Signed and Sealed this

Thirteenth Day of November, 2007

JON W. DUDAS
*Director of the United States Patent and Trademark Office*